United States Patent
Tang et al.

(10) Patent No.: US 9,651,866 B2
(45) Date of Patent: May 16, 2017

(54) MODIFIED POLYACRYLATE DISPERSANT, PIGMENT DISPERSION, COLER PHOTORESIST, COLOR FILTER SUBSTRATE AND DISPLAY DEVICE

(71) Applicant: BOE TECHNOLOGY GROUP CO., LTD., Beijing (CN)

(72) Inventors: Chen Tang, Beijing (CN); Xuelan Wang, Beijing (CN); Shan Chang, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 186 days.

(21) Appl. No.: 14/413,393

(22) PCT Filed: Jun. 17, 2014

(86) PCT No.: PCT/CN2014/080046
§ 371 (c)(1),
(2) Date: Jan. 7, 2015

(87) PCT Pub. No.: WO2015/100957
PCT Pub. Date: Jul. 9, 2015

(65) Prior Publication Data
US 2016/0272765 A1    Sep. 22, 2016

(30) Foreign Application Priority Data

Dec. 31, 2013  (CN) .......................... 2013 1 0752244

(51) Int. Cl.
| | | |
|---|---|---|
| *G03F 7/075* | (2006.01) |
| *G03F 7/028* | (2006.01) |
| *G03F 7/105* | (2006.01) |
| *G03F 7/033* | (2006.01) |
| *G03F 7/00* | (2006.01) |
| *C08F 220/18* | (2006.01) |
| *C08F 220/20* | (2006.01) |
| *C08F 220/10* | (2006.01) |
| *C08F 8/42* | (2006.01) |
| *C08L 83/10* | (2006.01) |
| *C08G 77/442* | (2006.01) |
| *G02B 5/22* | (2006.01) |

(52) U.S. Cl.
CPC .............. *G03F 7/0758* (2013.01); *C08F 8/42* (2013.01); *C08F 220/10* (2013.01); *C08F 220/18* (2013.01); *C08F 220/20* (2013.01); *C08G 77/442* (2013.01); *C08L 83/10* (2013.01); *G02B 5/223* (2013.01); *G03F 7/0007* (2013.01); *G03F 7/028* (2013.01); *G03F 7/033* (2013.01); *G03F 7/105* (2013.01)

(58) Field of Classification Search
None
See application file for complete search history.

(56) References Cited

U.S. PATENT DOCUMENTS

| | | |
|---|---|---|
| 6,391,471 B1 | 5/2002 | Hiraoka et al. |
| 6,933,345 B1 | 8/2005 | Lichtenhan et al. |

FOREIGN PATENT DOCUMENTS

| | | |
|---|---|---|
| CN | 1955843 A | 5/2007 |
| CN | 101024751 A | 8/2007 |
| CN | 101405132 A | 4/2009 |
| CN | 101511576 A | 8/2009 |
| CN | 101928489 A | 12/2010 |
| CN | 102443330 A | 5/2012 |
| CN | 102775567 A | 11/2012 |
| CN | 103755847 A | 4/2014 |
| WO | 03/102695 A1 | 12/2003 |
| WO | 20091095521 A1 | 8/2009 |

OTHER PUBLICATIONS

Machine-assisted English translation for CN 1955843 A (2007).*
International Search Report and Written Opinion in PCT International Application No. PCT/CN2014/080046, dated Aug. 20, 2014.

* cited by examiner

Primary Examiner — Sin Lee
(74) Attorney, Agent, or Firm — Brooks Kushman P.C.

(57) ABSTRACT

The disclosure discloses a polyacrylate dispersant, a pigment dispersion, a color photoresist, a color filter substrate and a display device. The polyacrylate dispersant of the disclosure is a polyhedral oligomeric silsesquioxane-modified polyacrylate dispersant prepared by an esterification reaction of a polyacrylate dispersant and polyhedral oligomeric silsesquioxane. Due to a steric hindrance effect of the structure of polyhedral oligomeric silsesquioxane, the polyacrylate dispersant of the disclosure may significantly improve the stability of pigment dispersion when used for dispersing pigment powder. A color photoresist prepared based on the pigment dispersion has a prominent heat resistance, an excellent resolution and a surface smoothness, as well as a low dielectric constant.

20 Claims, No Drawings

MODIFIED POLYACRYLATE DISPERSANT, PIGMENT DISPERSION, COLER PHOTORESIST, COLOR FILTER SUBSTRATE AND DISPLAY DEVICE

CROSS-REFERENCE TO RELATED APPLICATION

This application is the U.S. national phase of PCT Application No. PCT/CN2014/080046 filed on Jun. 17, 2014, which claims priority to Chinese Patent Application No. 201310752244.0 filed on Dec. 31, 2013, the disclosures of which are incorporated in their entirety by reference herein.

TECHNICAL FIELD

The disclosure relates to a modified polyacrylate dispersant, a pigment dispersion, a color photoresist, a color filter substrate and a display device.

BACKGROUND

A color filter is a key component of a liquid crystal display (LCD) for being capable of colorization. In methods for preparing the color filter, a pigment-dispersed method is the most commonly-used method. The pigment-dispersed method may include the following basic steps: coating a color photoresist on a base substrate, and solidifying the color photoresist with an ultraviolet irradiation or the like, to form a pigment photoresistance. The color photoresist includes a color dispersion, which mainly includes a colored pigment, a dispersant, a binder resin and a solvent. The colored pigment in the color dispersion may determine the color of the color photoresist finally formed. The stability of the color dispersion is very important. If the stability of the color dispersion used is not good enough, a deposition or even a cohesion of the pigment particles tends to occur in the pigment dispersion, directly resulting in an unsmooth surface of the color filter layer of the color filter, an uneven coating of the color filter layer, which may further lead to undesirable phenomena such as light leakage of the color filter.

Polyhedral Oligomeric Silsesquioxane (POSS) has a formula of $(RSiO_{1.5})_n$ (n is 6, 8, 10 or a larger even number, and R is an organic group), and is one kind of an organosilicon compound having a special polyhedral molecular structure. Polyhedral oligomeric silsesquioxane is an organic-inorganic nano-hybrided material on a molecular level, not only the structure of an inorganic silica skeleton thereof may provide a steric hindrance effect and enhance the heat resistance, but also the peripheral organic group thereof may increase its reactivity with different substrates.

In the prior art, the POSS structure is introduced into the resin generally by a method of directly mixing a chemical having a free POSS nano-structure or a method of copolymerization. A Chinese invention patent 200680042113.1 relates to a method of using a chemical having a POSS nano-structure as a dispersing addictives, a surface modifier and an interface friction modifier, in order to improve property of a polymer itself and a surface thereof. The patent relates to a method of directly mixing the chemical having the free POSS nano-structure, which results in a poor controllability, but if chemical modification is directly implemented to the polymer itself, a chemical or a physical property of the polymer itself may be influenced. A Chinese invention patent 200610137563.0 relates to a photosensitivity resin composition, which includes an acrylic copolymer, and the acrylic copolymer is obtained by copolymerization of the following compounds i) to iv): i) a polyhedral oligomeric silsesquioxane-containing unsaturated compound; ii) an unsaturated carboxylic acid, unsaturated carboxylic anhydride, or a mixture thereof; iii) an epoxy-containing unsaturated compound; and iv) an olefinic unsaturated compound. The photosensitivity resin composition not only has excellent performances such as homogeneity, sensitivity, resolution, heat resistance and transparency after being developed, but also an organic insulating film with a low dielectric constant can be achieved so as to decrease power consumption and reduce crosstalk. However, since the dispersant is prepared using the method of polymerization, controllability of the POSS modification degree in the dispersant is poor, so that a stable pigment solution using the dispersant may have a poor stability and tendency of agglomeration, and finally the performance of the color photoresist may be affected.

SUMMARY

The above methods of introducing a POSS structure by directly mixing, directly modifying a polymer itself or copolymerization all have a problem that a modification degree of the POSS structure is difficult to control relatively accurately.

A definition of "modification degree" used herein refers to a ratio of the number of carboxyl groups reacted with the POSS to the number of originally existed carboxyl groups in polyacrylate. For example, if all carboxyl groups in the polyacrylate react with the POSS, then the modification degree is defined as 100%.

Aiming at such a problem, the disclosure provides a POSS-modified polyacrylate dispersant and a method for preparing the same.

The POSS-modified polyacrylate dispersant of the disclosure is obtained by modifying a polyacrylate dispersant via an esterification reaction of the polyacrylate dispersant and a polyhydric POSS. The technical solution of the disclosure may control the modification degree of the POSS structure relatively accurately, and improve a dispersion stability of a pigment dispersion by sufficiently utilizing a steric hindrance effect of the POSS structure. When the POSS-modified polyacrylate dispersant is used for dispersing a pigment powder, the stability of the pigment dispersion can be improved due to the steric hindrance effect of the polyhedral oligomeric silsesquioxane structure. A color photoresist prepared using the pigment dispersion further has a prominent heat resistance, an excellent resolution and a surface smoothness, as well as a low dielectric constant.

The POSS-modified polyacrylate dispersant of the disclosure is prepared by the esterification reaction of the polyacrylate dispersant and the polyhydric POSS.

In an example of the disclosure, the POSS has a formula of $(SiO_{1.5})_m(C_6H_5)_{m-y}(C_6H_4OH)_y$, with m being an even number no less than 6 and no more than 10, and y being an integer from 1 to m.

The polyacrylate dispersant has a number-average molecular weight of 2000 to 20000, and an acid value of 5 to 60 mg KOH/g.

A modification degree of the POSS in the POSS-modified polyacrylate dispersant is 10% to 60%.

A method for preparing the POSS-modified polyacrylate dispersant provided by the disclosure includes: dissolving the polyacrylate dispersant and the polyhedral oligomeric silsesquioxane in an organic solvent, and performing a reaction in a presence of an amide condensation agent, to obtain the polyhedral oligomeric silsesquioxane-modified polyacrylate dispersant.

In an example of the disclosure, the amide condensation agent is 1-hydroxylbenzotriazole and 1-(3-dimethylaminopropyl)-3-ethylcarbodiimine; the organic solvent is dichloromethane.

The disclosure further provides a pigment dispersion.

The pigment dispersion provided by the disclosure includes a pigment powder, a dispersant, a dispersion resin, a first solvent and a second solvent, wherein the dispersant is the above POSS-modified polyacrylate dispersant.

In an example of the disclosure, the pigment powder is a green pigment, a yellow pigment, a red pigment, a blue pigment or a mixture thereof.

The dispersion resin is epoxy acrylate or modified styrene acrylate.

Based on a total weight of the pigment dispersion taken as 100%, the dispersant accounts for 2% to 13%, the dispersion resin accounts for 2% to 7%, the first solvent accounts for 40% to 75%, the pigment powder accounts for 15% to 30%, and the second solvent accounts for 5% to 10%.

The disclosure further provides a color photoresist.

The color photoresist provided by the disclosure includes a pigment dispersion, an alkali-soluble resin, a multifunctional monomer, a photoinitiator, an organic solvent and an addictive, wherein the pigment dispersion is the above pigment dispersion.

In an example of the disclosure, the alkali-soluble resin is methacrylic semi-ester or amine-modified acrylate.

The multifunctional monomer is epoxy acrylate, ethoxyl-containing methyl propane acrylate, aliphatic polyurethane acrylate or aliphatic polyisocyanate.

The photoinitiator is a ketoxime ester photoinitiator, an acetophenone photoinitiator or an aminoketone photoinitiator.

Based on a total weight of the color photoresist taken as 100%, the pigment dispersion accounts for 27% to 68%, the alkali-soluble resin accounts for 9% to 22%, the multifunctional monomer accounts for 2% to 5%, the photoinitiator accounts for 0.5% to 1%, the organic solvent accounts for 16% to 50%, and the addictive accounts for 0.9% to 1.0%.

The disclosure further provides a color filter substrate, which includes a color filter layer formed with the above color photoresist.

The disclosure further provides a display device, which includes the above color filter substrate.

The disclosure modifies the polyacrylate dispersant by the esterification reaction of the polyacrylate dispersant and the polyhydric POSS, thereby the disclosure can control the modification degree of the POSS structure relatively accurately. When the POSS-modified polyacrylate dispersant is used for dispersing a pigment powder, the stability of a pigment dispersion can be significantly improved due to the steric hindrance effect of the POSS structure. The color photoresist prepared based on the pigment dispersion has a prominent heat resistance, an excellent resolution and a surface smoothness, as well as a low dielectric constant.

DETAILED DESCRIPTION

When the POSS-modified polyacrylate dispersant of the disclosure is used for dispersing a pigment powder, the stability of a pigment dispersion can be significantly improved due to the steric hindrance effect of the POSS structure.

The POSS-modified polyacrylate dispersant according to present invention is prepared by an esterification reaction of a polyacrylate dispersant and a POSS. When it is used for dispersing a pigment powder, the stability of a pigment dispersion can be significantly improved due to the steric hindrance effect of the POSS structure.

For example, the POSS-modified polyacrylate dispersant of the disclosure is obtained by modifying the polyacrylate dispersant with POSS via an esterification reaction with the POSS, in which the esterification reaction is catalyzed by an amide condensation agent, such as 1-hydroxylbenzotriazole (HOBt) and 1-(3-dimethylaminopropyl)-3-ethylcarbodiimine (EDC).

POSS has a formula of $(SiO_{1.5})_m(C_6H_5)_{m-y}(C_6H_4OH)_y$, with m being selected from 6, 8, 10 or a larger even number, and y being an integer from 1 to m. In an example of the disclosure, m is 6, 8 or 10, and y is an integer from 1 to 3.

The polyacrylate dispersant has a number-average molecular weight selected from 2000 to 20000, and an acid value of 5 to 60 mg KOH/g. In an example of the disclosure, the polyacrylate dispersant has a number-average molecular weight of 5000 to 10000, and an acid value of 10 to 25 mg KOH/g.

The modification degree of the POSS in the POSS-modified polyacrylate dispersant is 10% to 60%, and in an example of the disclosure, the modification degree of the POSS is 20% to 40%.

A method for preparing the POSS-modified polyacrylate dispersant of the disclosure includes: dissolving the polyacrylate dispersant and the polyhedral oligomeric silsesquioxane in an organic solvent, and performing a reaction in a presence of an amide condensation agent, to obtain the polyhedral oligomeric silsesquioxane-modified polyacrylate dispersant.

Here, the amide condensation agent is 1-hydroxylbenzotriazole and 1-(3-dimethylaminopropyl)-3-ethylcarbodimide; the organic solvent is dichloromethane.

The POSS-modified polyacrylate dispersant of the disclosure may be used for dispersing a pigment powder, to obtain a stably dispersed pigment dispersion.

The pigment dispersion of the disclosure includes a pigment powder, a POSS-modified polyacrylate dispersant, a dispersion resin, a first solvent and a second solvent.

Here, the first solvent and the second solvent are different, which may both be selected from any organic solvent used in the existing pigment dispersion, for example, may be selected from one of or a mixture of two or more of: glycol ether, ethyl acetate, methyl ethyl ketone, methyl isobutyl ketone, monomethylether glycol ether, propylene glycol monomethyl ether, propylene glycol methyl ether acetate, propylene glycol monomethyl ether acetate, isopropanol, n-butanol and butanediol.

The pigment powder includes a green pigment, a yellow pigment, a red pigment, a blue pigment or a mixture thereof. The green pigment includes a phthalocyanine pigment, an azo pigment, a heterocyclic pigment or a mixture thereof; the yellow pigment includes an azo pigment, an azo condensation pigment, a heterocyclic pigment or a mixture thereof; the red pigment is selected from PR224, PR254, PR264, PR122, PR123, PR177, PR179, PR190 or the like, or a mixture thereat the blue pigment is selected from PB1, PB2, PB15, PB15:3, PB15:4, PB15:6, PB16, PB22, PB60 or the like, or a mixture thereof.

The dispersion resin is epoxy acrylate or modified styrene acrylate.

Specifically, the pigment dispersion includes: a dispersant having a weight percentage of 2% to 13%, a dispersion resin having a weight percentage of 2% to 7%, a first solvent having a weight percentage of 40% to 75%, a pigment powder having a weight percentage of 15% to 30% and a second solvent having a weight percentage of 5% to 10%.

The pigment dispersion of the disclosure may be prepared by grinding using a sand mill, the method for preparing the pigment dispersion includes: mixing a dispersant, a dispersion resin and a first solvent, performing agitating for 30 min to 60 min with an agitation speed of 1000 rpm to 3000 rpm; and then adding a pigment powder and a grinding bead having a particle size of 1 mm and having the same weight with the pigment powder, performing agitating for 60 min with an agitation speed of 2000 rpm to 4500 rpm; adding a second solvent, performing agitating for 10 min to 30 min with an agitation speed of 500 rpm to 100 rpm. After the grinding bead is filtered out, a pigment pre-mixture is obtained. The pigment pre-mixture is moved into a sand mill, and the pigment dispersion is obtained by means of grinding and dispersing the pigment pre-mixture, in which a method for grinding and dispersing is: firstly grinding at a low speed for 5 min to 10 min with a linear speed of the sand mill being 2 m/s to 6 m/s, and then grinding at a high speed for 2 hours to 6 hours with the linear speed of the sand mill being 7 m/s to 13 m/s.

The pigment dispersion of the disclosure may be used to prepare a color photoresist, which has a prominent heat resistance, an excellent resolution and a surface smoothness, as well as a low dielectric constant.

The color photoresist of the disclosure includes a pigment dispersion of the disclosure, an alkali-soluble resin, a multifunctional monomer, a photoinitiator, an organic solvent and an addictive.

The alkali-soluble resin is methacrylic semi-ester or amine-modified acrylate.

The multifunctional monomer is epoxy acrylate, ethoxyl-containing methyl propane acrylate, aliphatic polyurethane acrylate or aliphatic polyisocyanate.

The photoinitiator is a ketoxime ester photoinitiator, an acetonephenone photoinitiator or an amino ketone aminoketone photoinitiator.

The color photoresist of the disclosure specifically includes: the pigment dispersion having a weight percentage of 27% to 68%, the alkali-soluble resin having a weight percentage of 9% to 22%, the multifunctional monomer having a weight percentage of 2% to 5%, the photoinitiator having a weight percentage of 0.5% to 1%, the organic solvent having a weight percentage of 16% to 50%, the addictive having a weight percentage of 0.9% to 1.0%.

The color photoresist of the disclosure may be used to form a color filter layer in a color filter substrate, furthermore, may be used to manufacture a display device.

1.1 Preparation of Polyacrylate Dispersant

4 M of methyl methacrylate, 5 M of butyl methacrylate, 5 M of isobornyl methacrylate, 6 M of acrylic acid, a certain amount (1% mass of monomer) of dodecanethiol and a solvent of propylene glycol methyl ether acetate were premixed and heated up to 80□ by heating in an oil-bath, and then a thermal initiator of azodiisobutyronitrile was added slowly within 30 min, with the temperature being maintained at 80□ and the reaction being agitated for 5 hours. Petroleum ether was used for sedimentation after the reaction was completed, and then a product was obtained after being dried in vacuum. The product had a number-average molecular weight of 8000, an acid value of 40 mg KOH/g.

1.2 Preparation of POSS-Modified Polyacrylate Dispersant 1.2.1 Preparation of POSS-Modified Polyacrylate Dispersant P123

10 M of the above prepared polyacrylate dispersant and 2 M of polyhydric POSS $((SiO_{1.5})_6(C_6H_5)_5(C_6H_4OH))$ were dissolved in dichloromethane in an ice-bath, and 0.1 M of 1-hydroxylbenzotriazole (HOBt) and 0.1 M of 1-(3-dimethylaminopropyl)-3-ethylcarbodiimine (EDC) were added, and agitated for 12 hours at room temperature, and then the reaction was stopped. 5% of hydrochloric solution was used for extraction, and then 5% of sodium dicarbonate, deionized water and saturated saline solution were respectively used for washing, then after being dried in vacuum, the POSS-modified polyacrylate dispersant P123 was obtained, with a modification degree of 34%.

1.2.2 Preparation of POSS-Modified Polyacrylate Dispersant P125

10 M of the above polyacrylate dispersant and 1.2 M of the polyhydric POSS $((SiO_{1.5})_{10}(C_6H_5)_7(C_6H_4OH)_3)$ were dissolved in dichloromethane in an ice-bath, and 0.1 M of 1-hydroxylbenzotriazole (HOBt) and 0.1 M of 1-(3-dimethylaminopropyl)-3-ethylcarbodiimine (EDC) were added, and agitated for 12 hours at room temperature, and then the reaction was stopped. 5% of hydrochloric solution was used for extraction, and then 5% of dicarbonate, deionized water and saturated saline solution were respectively used for washing, then after being dried in vacuum, the POSS-modified polyacrylate dispersant P125 was obtained, with a modification degree of 20%.

1.3 Preparation of Pigment Dispersion

The above POSS-modified polyacrylate dispersant P123 and the above POSS-modified polyacrylate dispersant P125 were used for preparation of the pigment dispersion, in which the pigment dispersion includes a pigment powder, a dispersant, a dispersion resin, a first solvent and a second solvent. The dispersed liquid was prepared by grinding using a sand mill. Components and result evaluations of the pigment dispersion prepared in Examples 1 to 4 and Comparative example 1 of the disclosure are shown in Table 1. In Table 1, G58 is a green pigment powder from DIC Corporation, G04 is a yellow pigment liquid from Lanxess Company, Joncryl 611 is a dispersion resin from BASF Company, BASF A81 is a dispersion resin from BASF company, CN2284 is a dispersion resin, PMA is propylene glycol methyl ether acetate.

TABLE 1

| Component (weight percentage) | | Comparative Example 1 | Example 1 | Example 2 | Example 3 | Example 4 |
|---|---|---|---|---|---|---|
| pigment | G58 | 12.5 | 12.5 | 15.4 | 18.2 | 24.3 |
|  | G04 | 3.2 | 3.2 | 3.8 | 4.3 | 4.9 |
| dispersant |  | 2.3 (polyacrylate dispersant) | 2.3 (P123) | 4.1 (P123) | 6.5 (P125) | 12.4 (P125) |
| Dispersion | Joncryl | 1.2 | 1.2 | 2.4 | 3.8 | 5.1 |

TABLE 1-continued

| Component (weight percentage) | | Comparative Example 1 | Example 1 | Example 2 | Example 3 | Example 4 |
|---|---|---|---|---|---|---|
| resin | 611 | | | | | |
| | BASF A81 | 0 | 0 | 0 | 0.9 | 1.3 |
| | CN 2284 | 0.8 | 0.8 | 0.5 | 0 | 0 |
| First solvent | PMA | 75 | 75 | 63.8 | 57.2 | 44.8 |
| Second solvent | butanediol | 5 | 5 | 10 | 9.1 | 7.2 |
| Result evaluation | viscosity | 8.0 | 4.8 | 4.5 | 5.6 | 5.2 |
| | Stability evaluation (3 months) | ordinary | fine | fine | fine | fine |

According to Table 1, the pigment dispersions prepared with the POSS-modified polyacrylate dispersant in Examples 1 to 4 all had fine stability.

Preparation of Color Photoresist

The color dispersions prepared in Examples 1 to 4 and Comparative Example 1 are used to prepare color photoresist, in which the color photoresist includes a pigment dispersion, an alkali-soluble resin, a multifunctional monomer, an initiator, an addictive, and a solvent. Components and result evaluations of color photoresists prepared in Examples 5 to 8 and comparative example 2 of the disclosure are shown in Table 2.

In Table 2, B635 is an ethoxide branch-containing alkali-soluble resin, SR339LV is penta/hexa-acrylate, EB270 is aliphatic polyurethane diacrylic acid resin, OXE01 is a ketoxime ester photoinitiator. EEP is ethyl 3-ethoxy ethyl propionate, PMA is propylene glycol methyl ether acetate, 379 is an initiator; for the flatting agent or a coupling agent, A186 can be specifically choose.

massive development, with a low resolution, a poorer smoothness of surface and a dielectric constant of 3.3 to 3.5. The color photoresists prepared using the pigment dispersions in Examples 1 to 4 have a prominent heat resistance, an excellent resolution and a surface smoothness, as well as a dielectric constant of 2.6 to 3.0, which is relatively low.

The above examples illustrate that the modified polyacrylate dispersant of the disclosure is obtained by the esterification reaction of the polyacrylate dispersant and the polyhydric POSS, and such a modified polyacrylate dispersant can control the modification degree of the POSS structure relatively accurately. When the POSS-modified polyacrylate dispersant is used for dispersing the pigment powder, the stability of the pigment dispersion can be improved due to a steric hindrance effect of the POSS structure. A color photoresist prepared based on the pigment dispersion has a prominent heat resistance, an excellent resolution and a surface smoothness, as well as a low dielectric constant.

TABLE 2

| Component (weight percentage) | | Comparative example 2 | Example 5 | Example 6 | Example 7 | Example 8 |
|---|---|---|---|---|---|---|
| Pigment dispersion | Example 1 | 0 | 27 | 0 | 0 | 0 |
| | Example 2 | 0 | 0 | 30.2 | 0 | 0 |
| | Example 3 | 0 | 0 | 0 | 34.8 | 0 |
| | Example 4 | 0 | 0 | 0 | 0 | 68 |
| | Comparative example 1 | 27 | 0 | 0 | 0 | 0 |
| alkali-soluble resin | B635 | 22 | 22 | 17.4 | 18.5 | 9 |
| multifunctional monomer | SR399LV | 2.8 | 2.8 | 3.1 | 3.9 | 4.4 |
| | EB270 | 0.1 | 0.1 | 0.3 | 0.2 | 0.4 |
| initiator | 379 | 0.4 | 0.4 | 0.5 | 0.6 | 0.6 |
| | OXE01 | 0.2 | 0.2 | 0.3 | 0.3 | 0.4 |
| addictive | Flatting agent or coupling agent | 1.0 | 1.0 | 1.0 | 1.0 | 1.0 |
| solvent | EEP | 30.5 | 30.5 | 31.2 | 24.7 | 0.2 |
| solvent | PMA | 16 | 16 | 16 | 16 | 16 |
| Result evaluation | Development state | Massive development | Powdery development | Powdery development | Powdery development | Powdery development |
| | resolution | 20 μm, with burr at edge of pixel | 3 μm, with smooth edge of pixel without burr | 3 μm, with smooth edge of pixel without burr | 3 μm, with smooth edge of pixel without burr | 3 μm, with smooth edge of pixel without burr |
| | Surface of film layer | rough | smooth | smooth | smooth | smooth |

As shown in Table 2, the color photoresist prepared using the pigment dispersion in Comparative example 1 has a The above are merely the preferred embodiments of the disclosure. It should be noted that, a person skilled in the art may further make improvements and modifications without departing from the principle of the disclosure, and these improvements and modifications shall also be considered as the scope of the disclosure.

What is claimed is:

1. A modified polyacrylate dispersant, which is a polyhedral oligomeric silsesquioxane-modified polyacrylate dispersant prepared by an esterification reaction of a polyacrylate dispersant and polyhedral oligomeric silsesquioxane, wherein the polyhedral oligomeric silsesquioxane has a formula of $(SiO_{1.5})_m(C_6H_5)_{m-y}(C_6H_4OH)_y$, with m being an even number no less than 6 and no more than 10, and y being an integer from 1 to m.

2. The modified polyacrylate dispersant according to claim 1, wherein the polyacrylate dispersant before modification with the polyhedral oligomeric silsesquioxane has a number-average molecular weight of 2000 to 20000, and an acid value of 5 to 60 mg KOH/g.

3. The modified polyacrylate dispersant according to claim 2, wherein a method for preparing the modified polyacrylate dispersant comprises: dissolving the polyacrylate dispersant and the polyhedral oligomeric silsesquioxane in an organic solvent, and performing a reaction in a presence of an amide condensation agent, to obtain the polyhedral oligomeric silsesquioxane-modified polyacrylate dispersant.

4. The modified polyacrylate dispersant according to claim 3, wherein the amide condensation agent is 1-hydroxylbenzotriazole and 1-(3-dimethylaminopropyl)-3-ethylcarbodiimine; the organic solvent is dichloromethane.

5. The modified polyacrylate dispersant according to claim 1, wherein a modification degree of the polyhedral oligomeric silsesquioxane in the polyhedral oligomeric silsesquioxane-modified polyacrylate dispersant is 10% to 60%.

6. The modified polyacrylate dispersant according to claim 5, wherein a method for preparing the modified polyacrylate dispersant comprises: dissolving the polyacrylate dispersant and the polyhedral oligomeric silsesquioxane in an organic solvent, and performing a reaction in a presence of an amide condensation agent, to obtain the polyhedral oligomeric silsesquioxane-modified polyacrylate dispersant.

7. The modified polyacrylate dispersant according to claim 6, wherein the amide condensation agent is 1-hydroxylbenzotriazole and 1-(3-dimethylaminopropyl)-3-ethylcarbodiimine; the organic solvent is dichloromethane.

8. The modified polyacrylate dispersant according to claim 1, wherein a method for preparing the modified polyacrylate dispersant comprises: dissolving the polyacrylate dispersant and the polyhedral oligomeric silsesquioxane in an organic solvent, and performing a reaction in a presence of an amide condensation agent, to obtain the polyhedral oligomeric silsesquioxane-modified polyacrylate dispersant.

9. The modified polyacrylate dispersant according to claim 8, wherein the amide condensation agent is 1-hydroxylbenzotriazole and 1-(3-dimethylaminopropyl)-3-ethylcarbodiimine; the organic solvent is dichloromethane.

10. A pigment dispersion, comprising a pigment powder, a dispersant, a dispersion resin, a first solvent and a second solvent, wherein the dispersant is the polyhedral oligomeric silsesquioxane-modified polyacrylate dispersant according to claim 1.

11. The pigment dispersion according to claim 10, wherein the pigment powder is a green pigment, a yellow pigment, a red pigment, a blue pigment or a mixture thereof.

12. The pigment dispersion according to claim 10, wherein the dispersion resin is epoxy acrylate or modified of styrene acrylate.

13. The pigment dispersion according to claim 10, wherein based on a total weight of the pigment dispersion taken as 100%, the dispersant accounts for 2% to 13%, the dispersion resin accounts for 2% to 7%, the first solvent accounts for 40% to 75%, the pigment powder accounts for 15% to 30%, and the second solvent accounts for 5% to 10%.

14. A color photoresist, comprising a pigment dispersion, an alkali-soluble resin, a multifunctional monomer, a photoinitiator, an organic solvent and an addictive, wherein the pigment dispersion is the pigment dispersion according to claim 10.

15. The color photoresist according to claim 14, wherein based on a total weight of the color photoresist taken as 100%, the pigment dispersion accounts for 27% to 68%, the alkali-soluble resin accounts for 9% to 22%, the multifunctional monomer accounts for 2% to 5%, the photoinitiator accounts for 0.5% to 1%, the organic solvent accounts for 16% to 50%, and the addictive accounts for 0.9% to 1.0%.

16. The color photoresist according to claim 14, wherein the alkali-soluble resin is amine-modified acrylate; the multifunctional monomer is epoxy acrylate, ethoxylated methyl propane acrylate, aliphatic polyurethane acrylate or aliphatic polyisocyanate; the photoinitiator is a ketoxime ester photoinitiator, an acetophenone photoinitiator or an aminoketone photoinitiator.

17. A color filter substrate, comprising a color filter layer formed of the color photoresist according to claim 14.

18. A display device, comprising the color filter substrate according to claim 17.

19. The pigment dispersion according to claim 10, wherein the polyacrylate dispersant before modification with the polyhedral oligomeric silsesquioxane has a number-average molecular weight of 2000 to 20000, and an acid value of 5 to 60 mg KOH/g.

20. The pigment dispersion according to claim 10, wherein a modification degree of the polyhedral oligomeric silsesquioxane in the polyhedral oligomeric silsesquioxane-modified polyacrylate dispersant is 10% to 60%.

* * * * *

UNITED STATES PATENT AND TRADEMARK OFFICE
CERTIFICATE OF CORRECTION

| | | |
|---|---|---|
| PATENT NO. | : 9,651,866 B2 | Page 1 of 1 |
| APPLICATION NO. | : 14/413393 | |
| DATED | : May 16, 2017 | |
| INVENTOR(S) | : Chen Tang et al. | |

It is certified that error appears in the above-identified patent and that said Letters Patent is hereby corrected as shown below:

On the Title Page

Delete: "(54) MODIFIED POLYACRYLATE DISPERSANT, PIGMENT DISPERSION, COLER PHOTORESIST, COLOR FILTER SUBSTRATE AND DISPLAY DEVICE"

And Insert:

-- (54) MODIFIED POLYACRYLATE DISPERSANT, PIGMENT DISPERSION, COLOR PHOTORESIST, COLOR FILTER SUBSTRATE AND DISPLAY DEVICE --.

In the Claims

Column 10, Line 24, Claim 14:
After "an organic solvent and an"
Delete "addictive" and
Insert -- additive --.

Column 10, Line 34, Claim 15:
After "16% to 50%, and the"
Delete "addictive" and
Insert -- additive --.

Signed and Sealed this
Fifteenth Day of August, 2017

Joseph Matal
*Performing the Functions and Duties of the
Under Secretary of Commerce for Intellectual Property and
Director of the United States Patent and Trademark Office*